(12) United States Patent
Chen et al.

(10) Patent No.: US 12,510,827 B2
(45) Date of Patent: *Dec. 30, 2025

(54) EUV RADIATION SOURCE APPARATUS FOR LITHOGRAPHY

(71) Applicant: TAIWAN SEMICONDUCTOR MANUFACTURING COMPANY, LTD., Hsinchu (TW)

(72) Inventors: Yu-Chih Chen, Pingtung (TW); Po-Chung Cheng, Longxing Village (TW); Li-Jui Chen, Hsinchu (TW); Shang-Chieh Chien, New Taipei (TW); Sheng-Kang Yu, Hsinchu (TW); Wei-Chun Yen, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 549 days.

This patent is subject to a terminal disclaimer.

(21) Appl. No.: 17/885,217

(22) Filed: Aug. 10, 2022

(65) Prior Publication Data
US 2022/0382048 A1 Dec. 1, 2022

Related U.S. Application Data (63) Continuation of application No. 17/208,791, filed on Mar. 22, 2021, now Pat. No. 11,513,441, which is a
(Continued)

(51) Int. Cl.
*G03F 7/00* (2006.01)
*G02B 5/08* (2006.01)
(Continued)

(52) U.S. Cl.
CPC ....... *G03F 7/70175* (2013.01); *G02B 5/0891* (2013.01); *G02B 27/0006* (2013.01);
(Continued)

(58) Field of Classification Search
CPC ............. G03F 7/70175; G03F 7/70033; G03F 7/70891; G03F 7/70916; G03F 7/70925;
(Continued)

(56) References Cited

U.S. PATENT DOCUMENTS 7,999,241 B2 8/2011 Nagai et al.
8,796,666 B1 8/2014 Huang et al.
(Continued)

FOREIGN PATENT DOCUMENTS

CN 200993677 Y 12/2007
CN 102256429 A 11/2011
(Continued)

OTHER PUBLICATIONS

Non-Final Office Action issued in U.S. Appl. No. 16/420,134, dated May 18, 2020.
(Continued)

*Primary Examiner* — David E Smith
*Assistant Examiner* — Christopher J Gassen
(74) *Attorney, Agent, or Firm* — STUDEBAKER BRACKETT PLLC (57) ABSTRACT

An EUV collector mirror for an extreme ultra violet (EUV) radiation source apparatus includes an EUV collector mirror body on which a reflective layer as a reflective surface is disposed, a heater attached to or embedded in the EUV collector mirror body and a drain structure to drain melted metal from the reflective surface of the EUV collector mirror body to a back side of the EUV collector mirror body.

20 Claims, 9 Drawing Sheets

Related U.S. Application Data continuation of application No. 16/420,134, filed on May 22, 2019, now Pat. No. 10,955,752.

(60) Provisional application No. 62/691,481, filed on Jun. 28, 2018.

(51) Int. Cl.
  *G02B 27/00* (2006.01)
  *G21K 1/06* (2006.01)
  *H05G 2/00* (2006.01)

(52) U.S. Cl.
  CPC ...... *G03F 7/70033* (2013.01); *G03F 7/70891* (2013.01); *G03F 7/70916* (2013.01); *G21K 1/06* (2013.01); *H05G 2/0094* (2024.08)

(58) Field of Classification Search
  CPC ... G03F 7/2004; G03F 7/2008; G02B 5/0891; G02B 27/0006; G02B 7/1815; G21K 1/06; G21K 2201/067; G21K 1/062; H05G 2/005; H05G 2/008
  See application file for complete search history.

(56) References Cited

U.S. PATENT DOCUMENTS

| | | | |
|---|---|---|---|
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,869,928 B2 | 1/2018 | Huang et al. | |
| 9,869,934 B2 | 1/2018 | Huang et al. | |
| 9,869,939 B2 | 1/2018 | Yu et al. | |
| 10,379,443 B2 | 8/2019 | De Jong et al. | |
| 10,401,602 B2 | 9/2019 | Kim et al. | |
| 10,606,179 B2 | 3/2020 | Bieg | |
| 10,678,138 B2 | 6/2020 | Yen et al. | |
| 10,955,752 B2 | 3/2021 | Chen | |
| 2007/0187627 A1 | 8/2007 | Ershov et al. | |
| 2012/0057680 A1 | 3/2012 | Hemberg et al. | |
| 2017/0059837 A1 | 3/2017 | Kim et al. | |

FOREIGN PATENT DOCUMENTS

| | | |
|---|---|---|
| CN | 103064260 A | 4/2013 |
| CN | 103108480 A | 5/2013 |
| CN | 103108481 A | 5/2013 |
| JP | 2007134166 A | 5/2007 |

OTHER PUBLICATIONS

Notice of Allowance issued in U.S. Appl. No. 16/420,134, dated Nov. 18, 2020.
Non-Final Office Action issued in U.S. Appl. No. 17/208,791, dated Apr. 14, 2022.
Notice of Allowance issued in U.S. Appl. No. 17/208,791, dated Jul. 15, 2022.

EUV RADIATION SOURCE APPARATUS FOR LITHOGRAPHY

RELATED APPLICATION

This application is a continuation of application Ser. No. 17/208,791 filed Mar. 22, 2021, which is a continuation of application Ser. No. 16/420,134 filed May 22, 2019, now U.S. Pat. No. 10,955,752, which claims priority to U.S. Provisional Patent Application No. 62/691,481 filed Jun. 28, 2018, the entire content of each of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. For example, the need to perform higher resolution lithography processes grows. One lithography technique is extreme ultraviolet lithography (EUVL). The EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. One type of EUV light source is laser-produced plasma (LPP). LPP technology produces EUV light by focusing a high-power laser beam onto small tin droplet targets to form highly ionized plasma that emits EUV radiation with a peak maximum emission at 13.5 nm. The EUV light is then collected by a LPP EUV collector mirror and reflected by optics towards a lithography target, e.g., a wafer. The LPP EUV collector mirror is subjected to damage and degradation due to the impact of particles, ions, radiation, and most seriously, tin deposition.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of".

The present disclosure is generally related to extreme ultraviolet (EUV) lithography system and methods. More particularly, it is related to apparatus and methods for mitigating contamination on an EUV collector mirror in a laser produced plasma (LPP) EUV radiation source. The EUV collector mirror, also referred to as an LPP EUV collector mirror or an EUV collector mirror, is an important component of the LPP EUV radiation source. It collects and reflects EUV radiation and contributes to overall EUV conversion efficiency. However, it is subjected to damage and degradation due to the impact of particles, ions, radiation, and debris deposition. In particular, tin (Sn) debris is one of the contamination sources of the EUV collector mirror. EUV collector mirror life time, the time duration where the reflectivity decays to half of the initial reflectivity, is one of the most important factors for an EUV scanner. The major reason of reflectivity decay of the EUV collector mirror is residual metal contamination (tin debris) on the EUV collector mirror surface caused, inevitably, by the EUV light generation procedure.

One of the objectives of the present disclosure is directed to reducing debris deposition onto the LPP EUV collector mirror thereby increasing its usable lifetime. More specifically, this disclosure is directed to self-destroying a metallic coating and accumulation on the EUV collector mirror by active heating thereof up to a melting temperature of tin debris and a drain structure design. The technology of this disclosure keeps the EUV collector mirror in a desirable status for a longer period of time by reducing the frequency of swapping the EUV collector mirror. In other words, an EUV scanner will maintain the highest exposure power and throughput, and require less frequent maintenance, thereby reducing the frequency of the week-long down time required to swap EUV collector mirror.

Figure 1:
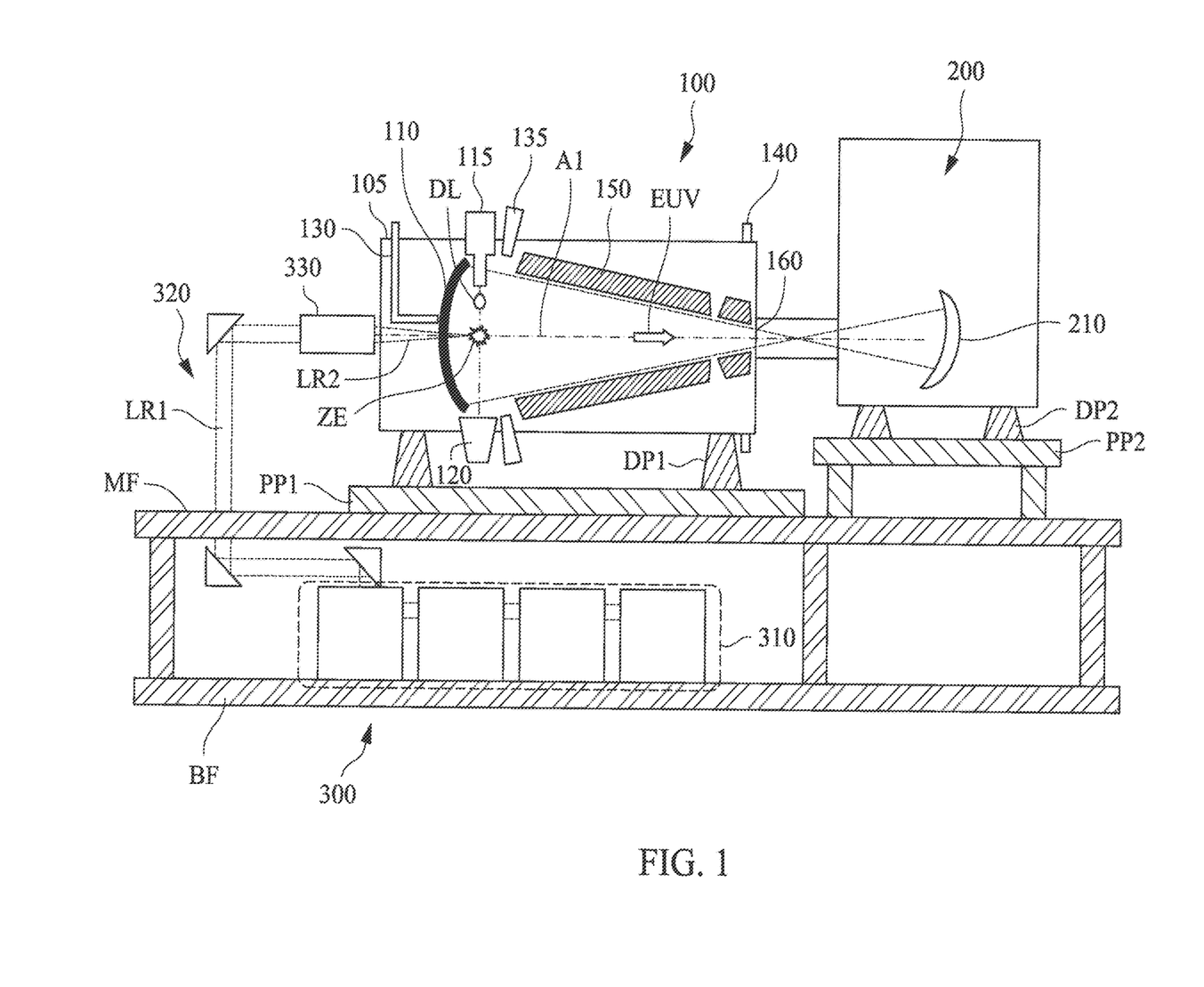
FIG. 1 is a schematic view of an EUV lithography system with a laser produced plasma (LPP) EUV radiation source, constructed in accordance with some embodiments of the present disclosure.

FIG. 1 is a schematic and diagrammatic view of an EUV lithography system. The EUV lithography system includes an EUV radiation source apparatus 100 to generate EUV light, an exposure tool 200, such as a scanner, and an excitation laser source apparatus 300. As shown in FIG. 1, in some embodiments, the EUV radiation source apparatus 100 and the exposure tool 200 are installed on a main floor MF of a clean room, while the excitation source apparatus 300 is installed in a base floor BF located under the main floor. Each of the EUV radiation source apparatus 100 and the exposure tool 200 are placed over pedestal plates PP1 and PP2 via dampers DP1 and DP2, respectively. The EUV radiation source apparatus 100 and the exposure tool 200 are coupled to each other by a coupling mechanism, which may include a focusing unit.

The lithography system is an extreme ultraviolet (EUV) lithography system designed to expose a resist layer by EUV light (or EUV radiation). The resist layer is a material sensitive to the EUV light. The EUV lithography system employs the EUV radiation source apparatus 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the mask is a reflective mask. One exemplary structure of the mask includes a substrate with a suitable material, such as a low thermal expansion material or fused quartz. In various examples, the material includes $TiO_2$ doped $SiO_2$, or other suitable materials with low thermal expansion. The mask includes multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure tool 200 includes a projection optics module 210 for imaging the pattern of the mask on to a semiconductor substrate with a resist coated thereon secured on a substrate stage of the exposure tool 200. The projection optics module generally includes reflective optics. The EUV radiation (EUV light) directed from the mask, carrying the image of the pattern defined on the mask, is collected by the projection optics module, thereby forming an image onto the resist.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform lithography exposing processes.

The lithography system may further include other modules or be integrated with (or be coupled with) other modules.

As shown in FIG. 1, the EUV radiation source 100 includes a target droplet generator 115 and a LPP EUV collector mirror 110, enclosed by a chamber 105. The target droplet generator 115 generates a plurality of target droplets DL. In some embodiments, the target droplets DL are tin (Sn) droplets. In some embodiments, the tin droplets each have a diameter about 30 microns (μm). In some embodiments, the tin droplets DL are generated at a rate about 50 droplets per second and are introduced into a zone of excitation ZE at a speed about 70 meters per second (m/s). Other material can also be used for the target droplets, for example, a tin containing liquid material such as eutectic alloy containing tin or lithium (Li).

The excitation laser LR2 generated by the excitation laser source apparatus 300 is a pulse laser. In some embodiments, the excitation layer includes a pre-heat laser and a main laser. The pre-heat laser pulse is used to heat (or pre-heat) the target droplet to create a low-density target plume, which is subsequently heated (or reheated) by the main laser pulse, generating increased emission of EUV light.

In various embodiments, the pre-heat laser pulses have a spot size about 100 μm or less, and the main laser pulses have a spot size about 200-300 μm.

The excitation laser (laser pulses) LR2 are generated by the excitation laser source 300. The laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source. The excitation laser (laser light) LR1 generated by the laser generator 300 is guided by the laser guide optics 320 and focused into the excitation laser LR2 by the focusing apparatus 330, and then introduced into the EUV radiation source 100.

The excitation laser (laser light) LR2 is directed through windows (or lenses) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits EUV radiation EUV, which is collected by the EUV collector mirror 110. The EUV collector mirror 110 further reflects and focuses the EUV radiation for the lithography exposing processes. In some embodiments, a droplet catcher 120 is installed opposite the target droplet generator 115. The droplet catcher 120 is used for catching excessive target droplets. For example, some target droplets may be purposely missed by the laser pulses.

The EUV collector mirror 110 is designed with a proper coating material and shape to function as a mirror for EUV collection, reflection, and focusing. In some embodiments, the EUV collector mirror 110 is designed to have an ellipsoidal geometry. In some embodiments, the coating material of the EUV collector mirror 100 is similar to the reflective multilayer of the EUV mask. In some examples, the coating material of the EUV collector mirror 110 includes a ML (such as a plurality of Mo/Si film pairs) and may further include a capping layer (such as Ru) coated on the ML to substantially reflect the EUV light. In some embodiments, the EUV collector mirror 110 may further include a grating structure designed to effectively scatter the laser beam directed onto the EUV collector mirror 110. For example, a silicon nitride layer is coated on the EUV collector mirror 110 and is patterned to have a grating pattern.

In such an EUV radiation source apparatus, the plasma caused by the laser application creates physical debris, such as ions, gases and atoms of the droplet, as well as the desired EUV radiation. It is necessary to prevent the accumulation of material on the EUV collector mirror 110 and also to prevent physical debris exiting the chamber 105 and entering the exposure tool 200.

As shown in FIG. 1, in some embodiments, a buffer gas is supplied from a first buffer gas supply 130 through the aperture in EUV collector mirror 110 by which the pulse laser is delivered to the tin droplets. In some embodiments, the buffer gas is $H_2$, He, Ar, N or another inert gas. In certain embodiments, $H_2$ is used as H radicals generated by ionization of the buffer gas can be used for cleaning purposes. The buffer gas can also be provided through one or more second buffer gas supplies 135 toward the EUV collector mirror 110 and/or around the edges of the EUV collector mirror 110. Further, the chamber 105 includes one or more gas outlets 140 so that the buffer gas is exhausted outside the chamber 105.

Hydrogen gas has low absorption to the EUV radiation. Hydrogen gas reaching to the coating surface of the EUV collector mirror 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the $SnH_4$ from entering the exposure tool 200.

To trap the $SnH_4$ or other debris, one or more debris collection mechanisms (DCM) 150 are employed in the chamber 105.

Figure 2A:
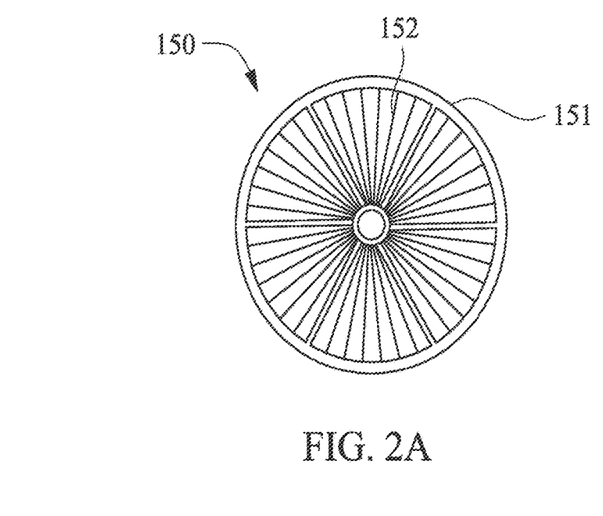
FIG. 2A is a schematic front view of a debris collection mechanism used in the EUV radiation source according to some embodiments of the present disclosure.
Figure 2B:
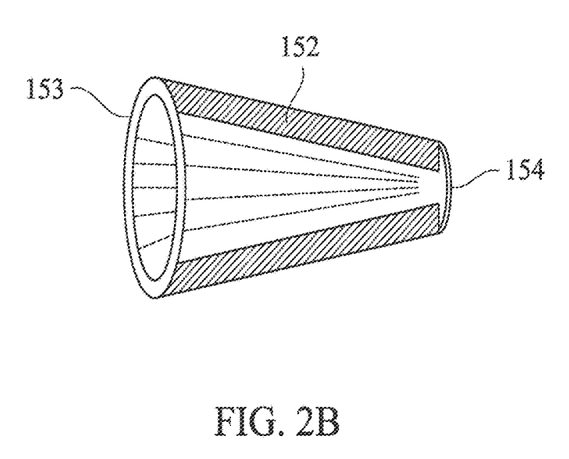
FIG. 2B is a schematic side view of a debris collection mechanism used in the EUV radiation source according to some embodiments of the present disclosure.
Figure 2C:
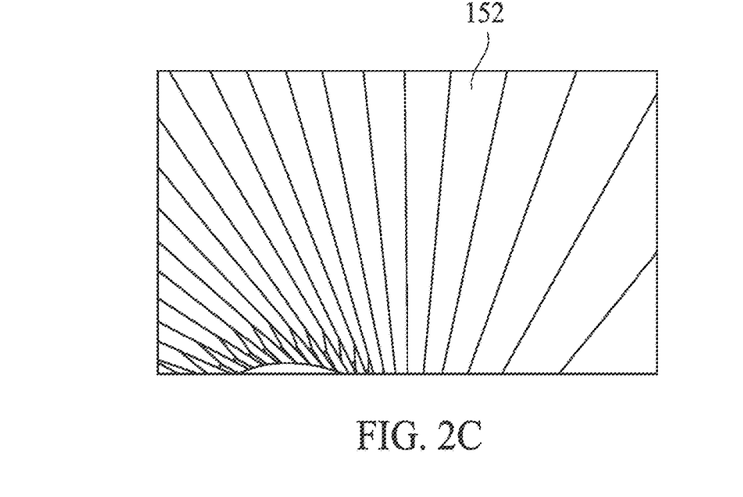
FIG. 2C is a partial picture of a vane used in the EUV radiation source according to some embodiments of the present disclosure.

As shown in FIG. 1, one or more DCMs 150 are disposed along optical axis A1 between the zone of excitation ZE and an output port 160 of the EUV radiation source 100. FIG. 2A is a front view of the DCM 150 and FIG. 2B is a schematic side view of DCM 150. FIGS. 2A to 2C is a partial picture of the DCM 150. The DCM 150 includes a frustoconical support frame 151, a first end support 153 and a second end support 154 that operably support a plurality of vanes 152 that rotate within the housings. The first end support 153 has a larger diameter than the second end support 154. The DCM 150 serves to prevent the surface of EUV collector mirror 110 and/or other elements/portions of the inside the chamber 105 from being coated by Sn vapor by sweeping out slow Sn atoms and/or $SnH_4$ via rotating vanes 152.

The plurality of vanes 152 project radially inwardly from the frustoconical support frame 151. The vanes 152 are thin and elongate plates. In some embodiments, each of the vanes has a triangular or trapezoid or trapezium shape in plan view. The vanes 152 are aligned so that their longitudinal axes are parallel to the optical axis A1 so that they present the smallest possible cross-sectional area to the EUV radiation EUV. The vanes 152 project towards the optical axis A1, but do not extend as far as the optical axis. In some embodiments, a central core of the DCM 150 is empty. The DCM 150 is rotated by a drive unit including one or more motors, one or more belts and/or one or more gears, or any rotating mechanism. The vanes 152 are heated at 100° C. to 400° C. by a heater in some embodiments.

Figure 3A:
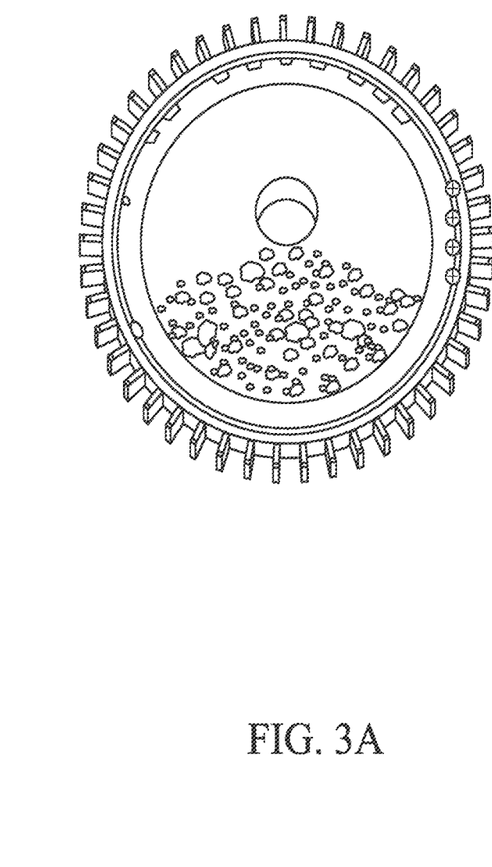
FIG. 3A shows an EUV collector mirror after the use, on which tin debris are deposited.
Figure 3B:
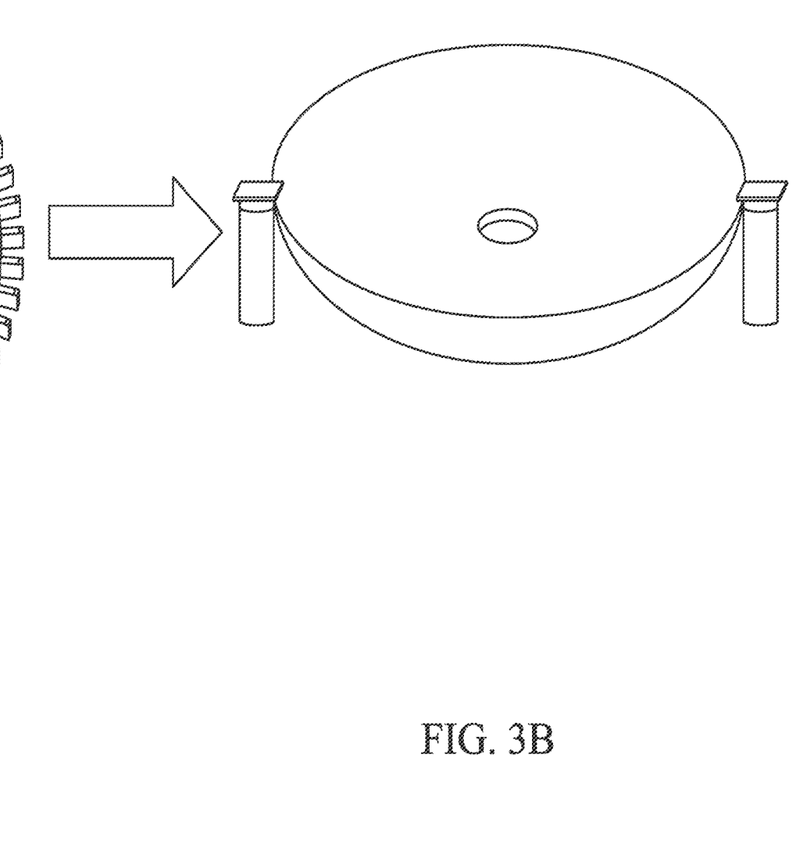
FIG. 3B shows an EUV collector mirror after cleaning the surface thereof.

FIG. 3A shows an EUV collector mirror after the use, on which tin debris are deposited, and FIG. 3B shows an EUV collector mirror after cleaning the surface thereof.

As set forth above, EUV collector mirror contamination by the residual metal from the EUV light generation procedure is the major cause of the EUV scanner exposure power loss and throughput down trend. The EUV collector mirror life time is maintained at about 3 months, for example, and then it is generally necessary for a week or more of down time to swap the EUV collector mirror with a new EUV collector mirror to maintain high exposure power and throughput.

In the present embodiments, the metal contamination is removed by heating the EUV collector mirror up to the melting temperature of the metal. This can mitigate the impact of reflectivity loss by drain holes and cross area contamination.

Figure 4:
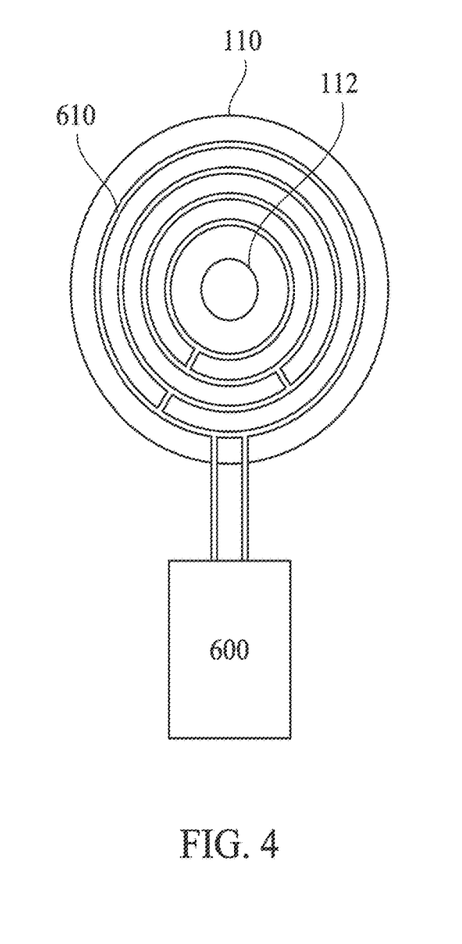
FIG. 4 shows a schematic view of an EUV collector mirror according to an embodiment of the present disclosure.
Figure 5A:
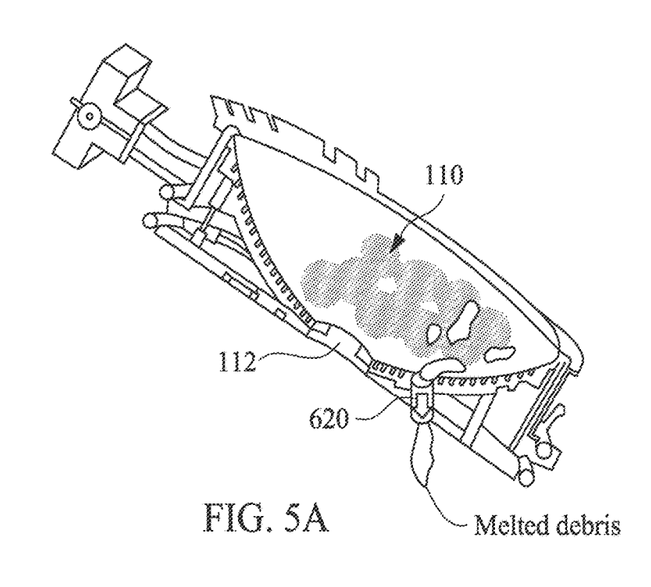
FIGS. 5A and 5B show a schematic view of an EUV collector mirror according to an embodiment of the present disclosure.
Figure 5B:
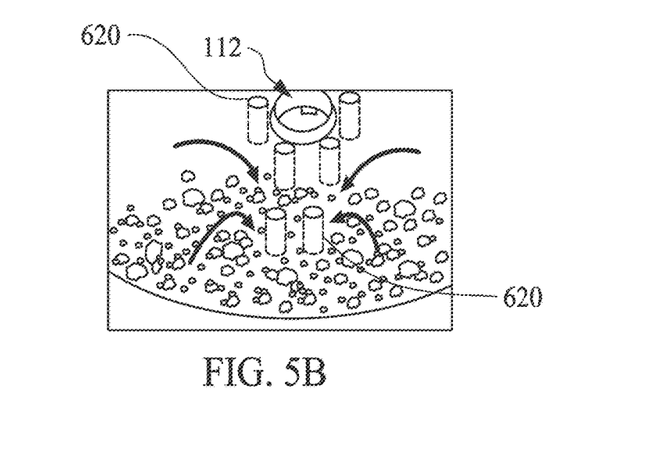

FIGS. 4, 5A and 5B show schematic views of an EUV collector mirror according to embodiments of the present disclosure.

An EUV collector mirror 110 has a curved reflective surface 110R (see, FIGS. 7A-7C) on which EUV radiation generated by the laser produced plasma is reflected and focused. In some embodiments, the reflective surface includes a plurality of film pairs, such as molybdenum-silicon (Mo/Si) film pairs (e.g., a layer of molybdenum above or below a layer of silicon in each film pair), or molybdenum-beryllium (Mo/Be) film pairs, or other suitable materials that are configurable to highly reflect the EUV light. The reflective film pairs are disposed on a mirror base body 110B (see, FIGS. 7A-7C) made of, for example, metal (e.g., stainless steel), semiconductor (e.g., silicon) and dielectric (e.g., glass or quartz), or other suitable material.

In some embodiments, a heater is connected to an EUV collector mirror 110, as shown in FIG. 4. In some embodiments, the heater includes one or more heating wires 610 embedded in the EUV collector mirror 110 or one or more heating wires 610 attached to a back surface of the EUV collector mirror 110. When the heating wires 610 is embedded in the EUV collector mirror 110, heating efficiency is higher than the case where the heating wires 610 are attached to the back surface of the collector mirror 110, and thus it is possible to reduce power consumption. On the other hand, it is easier to attach the heating wires 610 to the back surface of the EUV collector mirror than to dispose the heating wires 610 inside the collector mirror. In some embodiments, the heating wires 610 includes Ni—Cr alloy wires and/or Fe—Cr—Al alloy wires. A power supply 600 provides electric power to the heating wires 610 and controls the heating temperature of the EUV collector mirror 110. In other embodiments, the heater is an infrared radiation heater that heats the reflective surface and/or the back surface of the EUV collector mirror 110. In some embodiments, the heating wires 610 are divided into a plurality of sections, which are independently controlled by the power supply 600. With this feature, it is possible to locally heat a part of the EUV collector mirror 110 where the debris are heavily piled up.

In some embodiments, the EUV collector mirror 110 is heated to a temperature equal to or higher than about 200° C. to about 325° C. In other embodiments, the EUV collector mirror 110 is heated to a temperature equal to or higher than about 232° C. to melt the metal debris. Further, by heating the EUV collector mirror, it is possible to prevent metal debris from sticking on the surface of the EUV collector mirror. In some embodiments, the EUV collector mirror is configured such that a desired focal point is obtained when the EUV collector mirror is heated so that the EUV collector mirror can be heated to melt the metal debris during an EUV radiation operation.

As shown in FIGS. 5A and 5B, the EUV collector mirror includes one or more drain holes 620 to drain melted metal debris (contamination) from the surface of the EUV collector mirror 110. The heater heats the EUV collector mirror to or higher than the melting point of the metal (e.g., tin) debris so that the melted metal is drained through the drain holes 620. In some embodiments, the drain holes include open/close caps to drain the melted metal when necessary. The open/close caps are controlled by control circuitry in some embodiments.

In some embodiments, a plurality of drain holes are provided. In some embodiments, the drain holes surround a center hole 112 of the EUV collector mirror 110 as shown in FIG. 5B. In some embodiments, the drain hole is provided at or near the lowest position of the EUV collector mirror when the EUV collector mirror is installed in an EUV radiation source apparatus and the EUV radiation source apparatus is in operation, so that melted debris flows along the reflective surface of the EUV collector mirror and flows to the drain hole by the gravity. The drain hole is connected to a drain pipe to drain the melted metal debris to outside the EUV radiation source apparatus in some embodiments.

Figure 6:
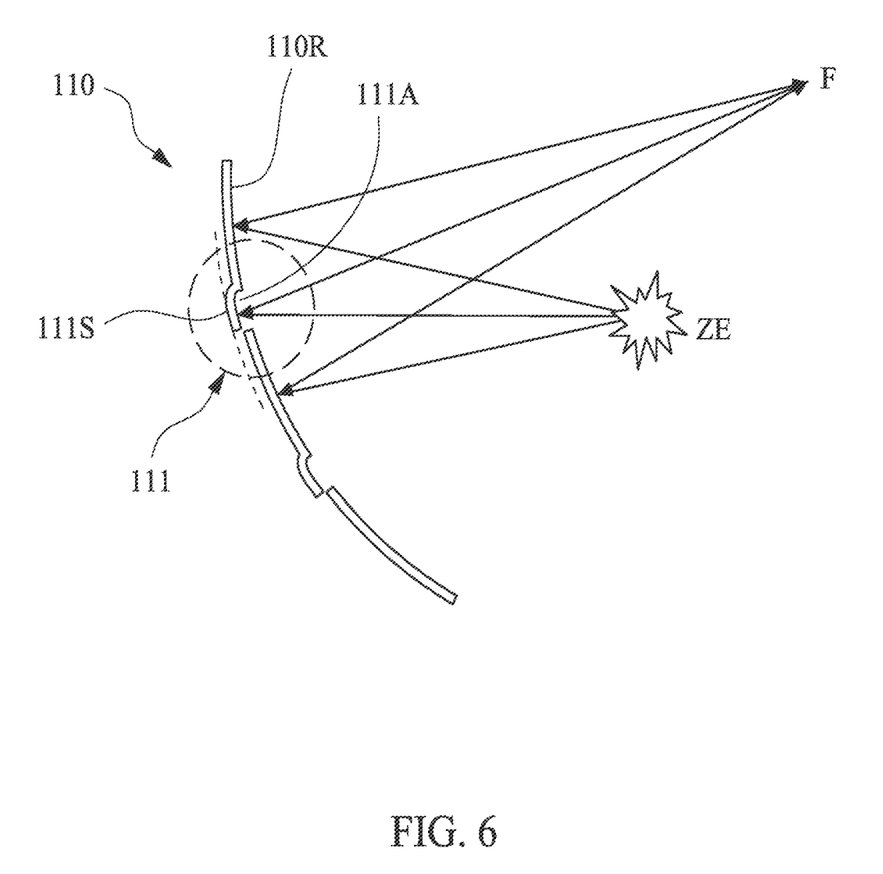
FIG. 6 shows a schematic view of an EUV collector mirror according to an embodiment of the present disclosure.

FIG. 6 show a schematic view of an EUV collector mirror according to an embodiment of the present disclosure. In some embodiments, the EUV collector mirror 110 has a grating drain structure 111 provided on the reflective surface, as shown in FIG. 6. The drain structure 111 collects metal debris melted by the heater and guides the collected metal debris to the back side of the EUV collector mirror 110. In some embodiments, the drain structure 111 includes an opening 111A (see also, FIGS. 7A-7C) to collect the melted metal debris and a bottom surface 111S. The bottom surface 111S is an EUV reflective surface and has a similar curvature to the main reflective surface 110R of the EUV collector mirror 110 such that EUV radiation reflected at the main reflective surface 110R and EUV radiation reflected at the bottom surface 111S make the same focus point F. In some embodiments, the bottom surface 111S includes a plurality of film pairs, such as molybdenum-silicon (Mo/Si) film pairs (e.g., a layer of molybdenum above or below a layer of silicon in each film pair), or molybdenum-beryllium (Mo/Be) film pairs, or other suitable materials that are configurable to highly reflect the EUV light. In other embodiments, the bottom surface 111S is not EUV reflective and does not include the Mo/Si or Mo/Be film pairs.

Figure 7A:
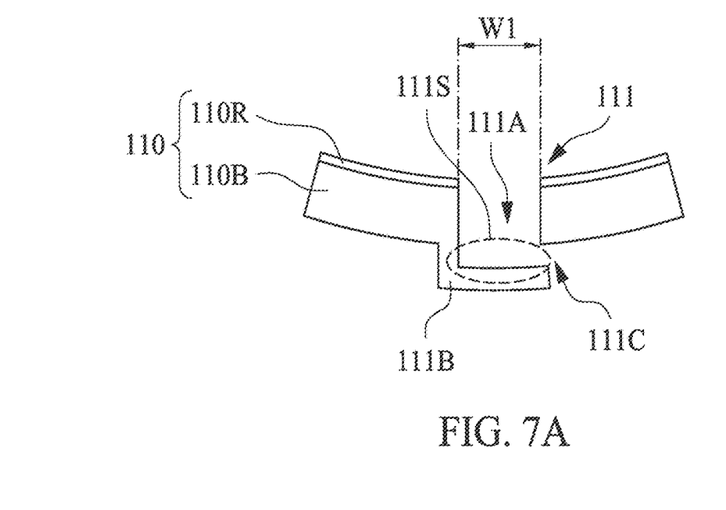
FIGS. 7A, 7B and 7C show schematic cross sectional views of drain structures according to embodiments of the present disclosure.
Figure 7B:
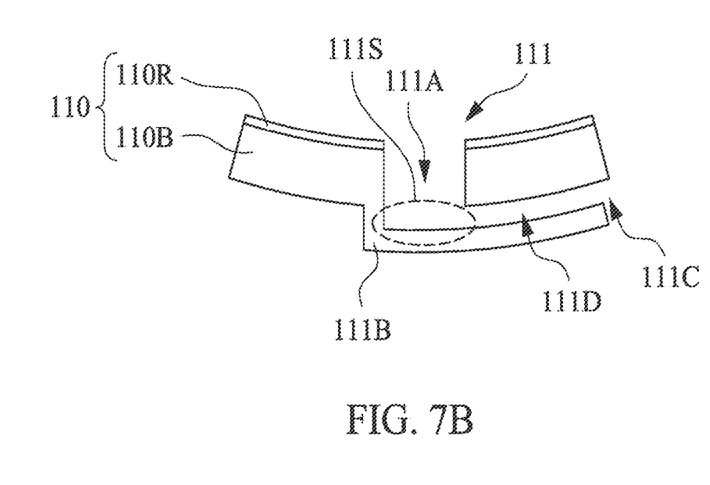
Figure 7C:
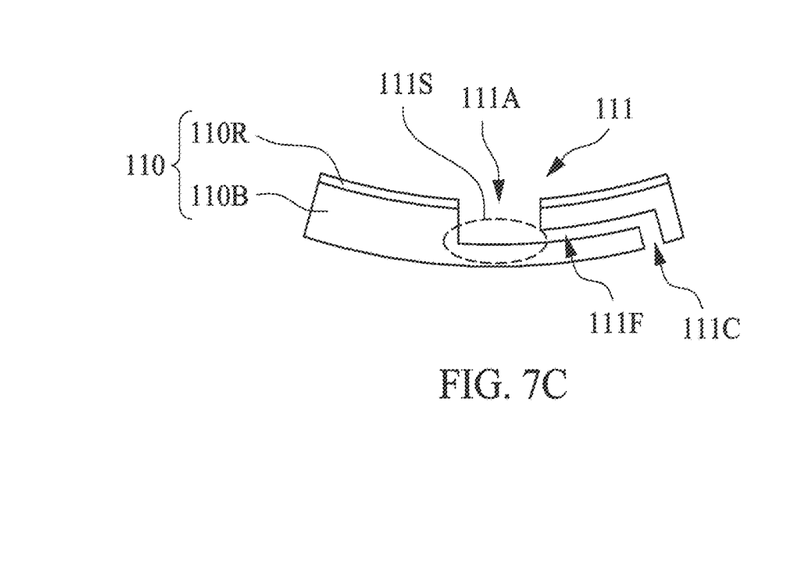

FIGS. 7A, 7B and 7C show schematic cross sectional views of drain structures 111 according to embodiments of the present disclosure.

In some embodiments, as shown in FIG. 7A, the opening 111A is a slit passing through a reflective surface (reflective layer) 110R and a mirror base body 110B of the EUV collector mirror 111. The bottom surface 111S is on a bottom support 111B as shown in FIG. 7A. At least one end of the bottom support 111B is opened to provide a drain 111C. In some embodiments, the drain 111C is connected to a drain pipe to drain the melted metal debris to outside the EUV radiation source apparatus. In some embodiments, the width W1 of the slit 111A is in a range from about 0.5 mm to about 5 mm and is in a range from about 1 mm to about 3 mm in other embodiments. In the configuration of FIG. 7A, it is easier to provide the bottom support at the bottom of the opening 111A by simply attaching the bottom support to the EUV collector mirror 110.

In some embodiments, as shown in FIG. 7B, the bottom support 111B extends along the back side of the EUV collector mirror 111 to form a conduit 111D connected to the drain 111C. In the configuration of FIG. 7A, it is easier to provide the bottom support at the bottom of the opening 111A by simply attaching the bottom support to the EUV collector mirror 110. Further, by using the conduit 111D, it is possible to guide the melted metal debris to a desired location.

In some embodiments, as shown in FIG. 7C, the opening 111A is a groove formed in the EUV collector mirror 111, and a conduit 111F is provided inside the EUV collector mirror. A drain 111C is connected to the conduit 111F. In some embodiments, the conduit 111F is provided in the base of the EUV collector mirror. In the configuration of FIG. 7C, since the bottom surface 111S is located closer to the curved reflective surface 110R, it is easier to secure that the reflected EUV light focuses at the same focus point F.

FIGS. 8A, 8B, 8C, 8D, 8E and 8F show schematic plan views of an EUV collector mirror according to embodiments of the present disclosure.

Figure 8A:
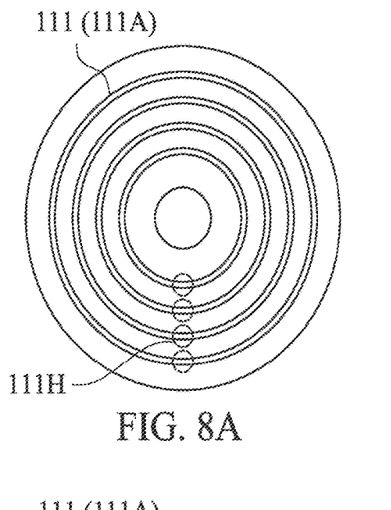
FIGS. 8A, 8B, 8C, 8D, 8E and 8F show schematic views of an EUV collector mirror according to embodiments of the present disclosure.

In some embodiments, multiple drain structures 111 are arranged in a concentric manner as shown in FIG. 8A. An interval between adjacent drain structures 111 is in a range from about 10 mm to about 50 mm in some embodiments. In some embodiments, the drain holes 111H are connected to the drain structures 111, respectively, at the back side of the EUV collector mirror. However, the locations of the drain holes 111H are not limited to the arrangement of FIG. 8A. In some embodiments, the drain holes 111H are located at or near the lowest position of the EUV collector mirror when the EUV collector mirror is installed in an EUV radiation source apparatus.

Figure 8B:
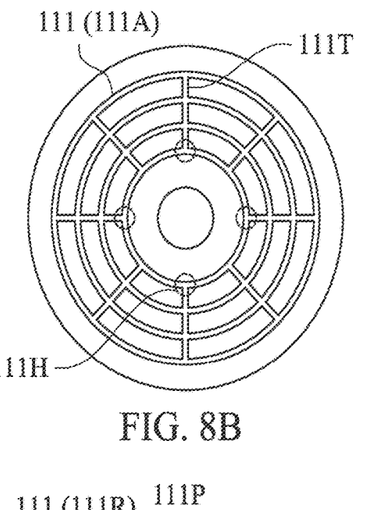
Figure 8C:
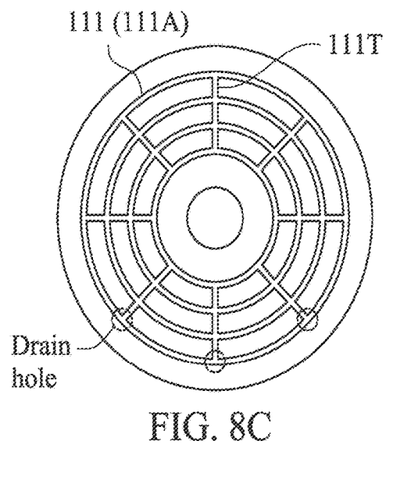

In some embodiments, multiple drain structure 111 are arranged in a concentric manner and connected by trunk conduits 111T, as shown in FIGS. 8B and 8C. In some embodiments, the trunk conduits 111T are provided on the backside of the EUV collector mirror similar to the conduit 111D of FIG. 7B, and in other embodiments, the trunk conduits 111T are inside the EUV collector mirror similar to the conduit 111F of FIG. 7C. In some embodiments, the drain holes 111H are connected to one of the concentric drain structures 111, as shown in FIGS. 8B and 8C. However, the locations of the drain holes 111H are not limited to the arrangement of FIGS. 8B and 8C. In some embodiments, the drain holes 111H are located at or near the lowest position of the EUV collector mirror when the EUV collector mirror is installed in an EUV radiation source apparatus. In some embodiments, a width of the trunk conduit 111T is greater than the width of the drain structures 111. By using the trunk conduits 111T, it is possible to avoid the melted metal debris from traveling a long distance to the drain holes, and thus to improve collection efficiency of the meted metal debris.

Figure 8D:
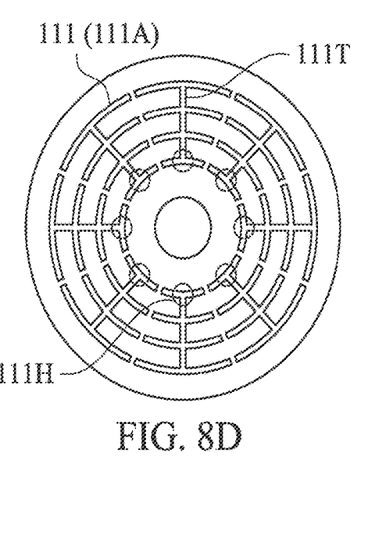

In some embodiments, multiple drain structure 111 are arranged in a concentric manner and connected by trunk conduits 111T as shown in FIG. 8D. In FIG. 8D, the concentric drain structures 111 are divided into multiple portions and one or more trunk conduits 111T connect the divided drain structures, so as to form groups of drain structures. In some embodiments, the trunk conduits 111T are on the back side of the EUV collector mirror similar to the conduits 111D of FIG. 7B, and in other embodiments, the trunk conduits 111T are provided inside the EUV collector mirror similar to the conduit 111F of FIG. 7C. In some embodiments, the drain holes 111H are connected to one of the divided concentric drain structures 111, as shown in FIG. 8D. However, the locations of the drain holes 111H are not limited to the arrangement of FIG. 8D. In some embodiments, the drain holes 111H are located at or near the lowest position of the EUV collector mirror when the EUV collector mirror is installed in an EUV radiation source apparatus.

Figure 8E:
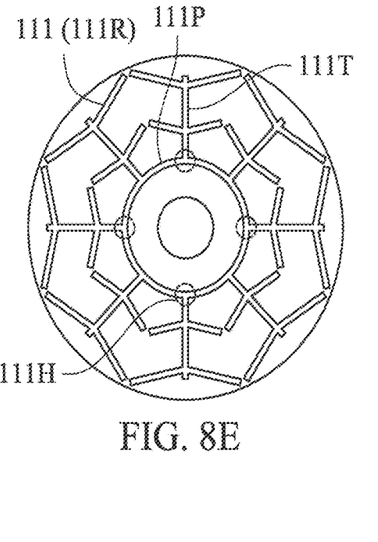
Figure 8F:
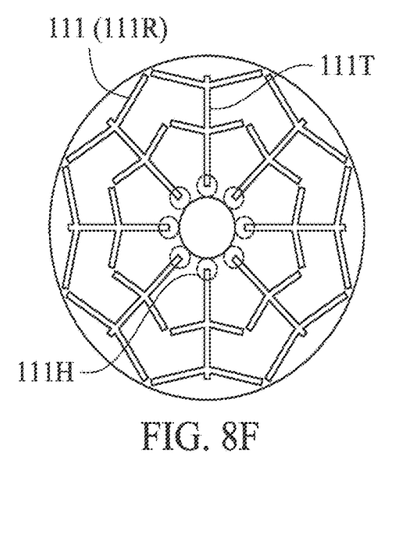

In some embodiments, drain structures 111 includes trunk conduits 111T and branch openings 111R as shown in FIG. 8F. In FIG. 8E, the branch openings 111R are slits or grooves to collect the melted metal debris similar to openings 111A. The branch openings 111R protrude from the trunk conduit 111T and the trunk conduit 111T is connected to a concentric conduit 111P, as shown in FIG. 8E. One or more drain holes 111H are provided to the concentric conduit 111P, as shown in FIG. 8E. However, the locations of the drain holes 111H are not limited to the arrangement of FIG. 8E. In some embodiments, the drain holes 111H are located at or near the lowest position of the EUV collector mirror when the EUV collector mirror is installed in an EUV radiation source apparatus. In some embodiments, the trunk conduits 111T and/or the concentric conduit 111P are provided on the backside of the EUV collector mirror similar to the conduit 111D of FIG. 7B, and in other embodiments, the trunk conduits 111T and/or the concentric conduit 111P are inside the EUV collector mirror similar to the conduit 111F of FIG. 7C.

In some embodiments, drain structures 111 includes trunk conduits 111T and branch openings 111R as shown in FIG. 8F. In FIG. 8F, the branch openings 111R are slits or grooves to collect the melted metal debris similar to openings 111A. The branch openings 111R protrude from the trunk conduit 111T, as shown in FIG. 8F. One or more drain holes 111H are provided at the ends of the trunk conduits 111T, as shown in FIG. 8F. However, the locations of the drain holes 111H are not limited to the arrangement of FIG. 8F. In some embodiments, the drain holes 111H are located at or near the lowest position of the EUV collector mirror when the EUV collector mirror is installed in an EUV radiation source apparatus. In some embodiments, the trunk conduits 111T are on the backside of the EUV collector mirror similar to the conduit 111D of FIG. 7B, and in other embodiments, the trunk conduits 111T are inside the EUV collector mirror similar to the conduit 111F of FIG. 7C.

In the configurations of FIGS. 8B, 8C and 8E, since the drain holes 111H are communicably connected by a drain structure or a conduit, even if one of the drain holes is clogged, it is still possible to drain the melted metal debris from the remaining drain holes. When the drain structures are divided as shown in FIGS. 8D-8F, cleaning the drain structures is easier than the structure having a long drain or conduit.

FIGS. 9A, 9B, 9C and 9D show schematic plan views of an EUV collector mirror according to embodiments of the present disclosure.

In the embodiments of FIGS. 8A-8F, the drain structure 111 is provided to an entire reflective surface of the EUV collector mirror 110. However, the location on which the metal debris is deposited is limited to a specific location as shown in FIG. 3A in some embodiments. Accordingly, to suppress reduction of the total reflected EUV radiation, the drain structure 111 is provided in a limited area in the embodiments of FIGS. 9A-9D. In other words, the reflection surface of the EUV collector mirror 110 includes a drain-structure free area 111X.

In some embodiments, the drain-structure free area 111X has a fan shape having a central angle θ. In some embodiments, the central angle θ is in a range from about 30 degrees to about 315 degrees.

Figure 9A:
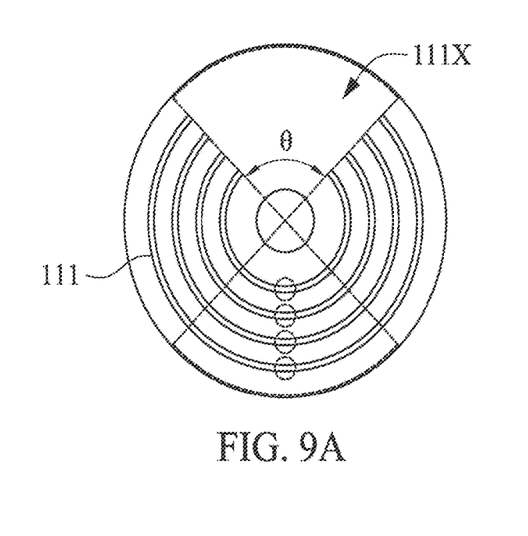
FIGS. 9A, 9B, 9C and 9D show schematic views of an EUV collector mirror according to embodiments of the present disclosure.

In some embodiments, as shown in FIG. 9A, when the reflective surface of the EUV collector mirror 110 is equally divided into four fan areas (quadrants), at least one quadrant area (θ=90 degrees) is free from the drain structure.

Figure 9B:
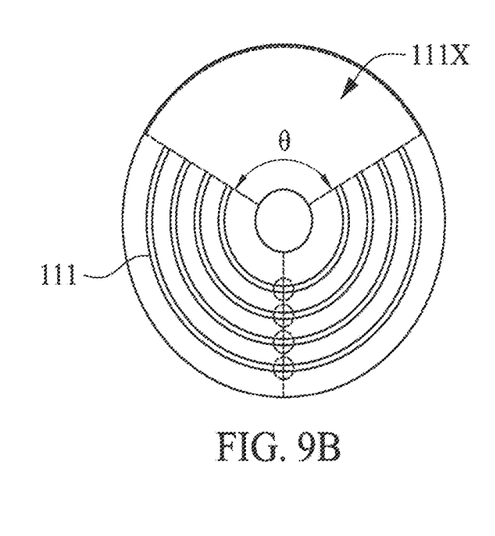

In some embodiments, as shown in FIG. 9B, when the reflective surface of the EUV collector mirror 110 is equally divided into three fan areas (thirds), at least one of the ⅓ areas (θ=120 degrees) is free from the drain structure.

Figure 9C:
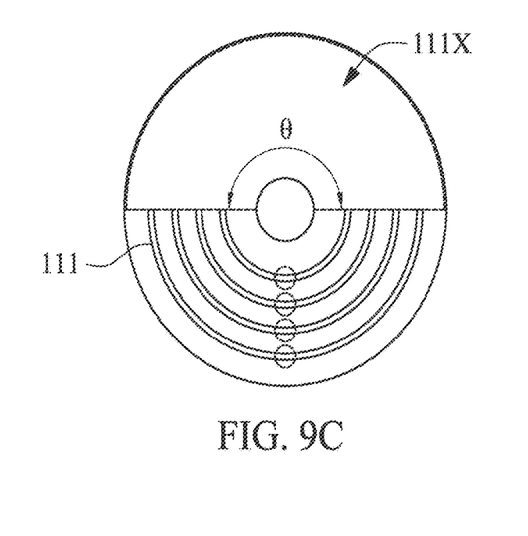

In some embodiments, as shown in FIG. 9C, when the reflective surface of the EUV collector mirror 110 is equally divided into two fan areas (half circle), at least half the circle is (θ=180 degrees) is free from the drain structure.

Figure 9D:
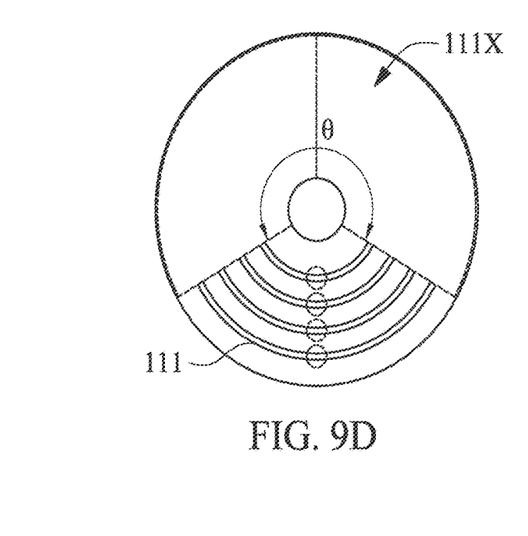

In some embodiments, as shown in FIG. 9D, when the reflective surface of the EUV collector mirror 110 is equally divided into three fan areas (thirds), at least the ⅔ of the area (θ=240 degrees) is free from the drain structure.

Figure 10:
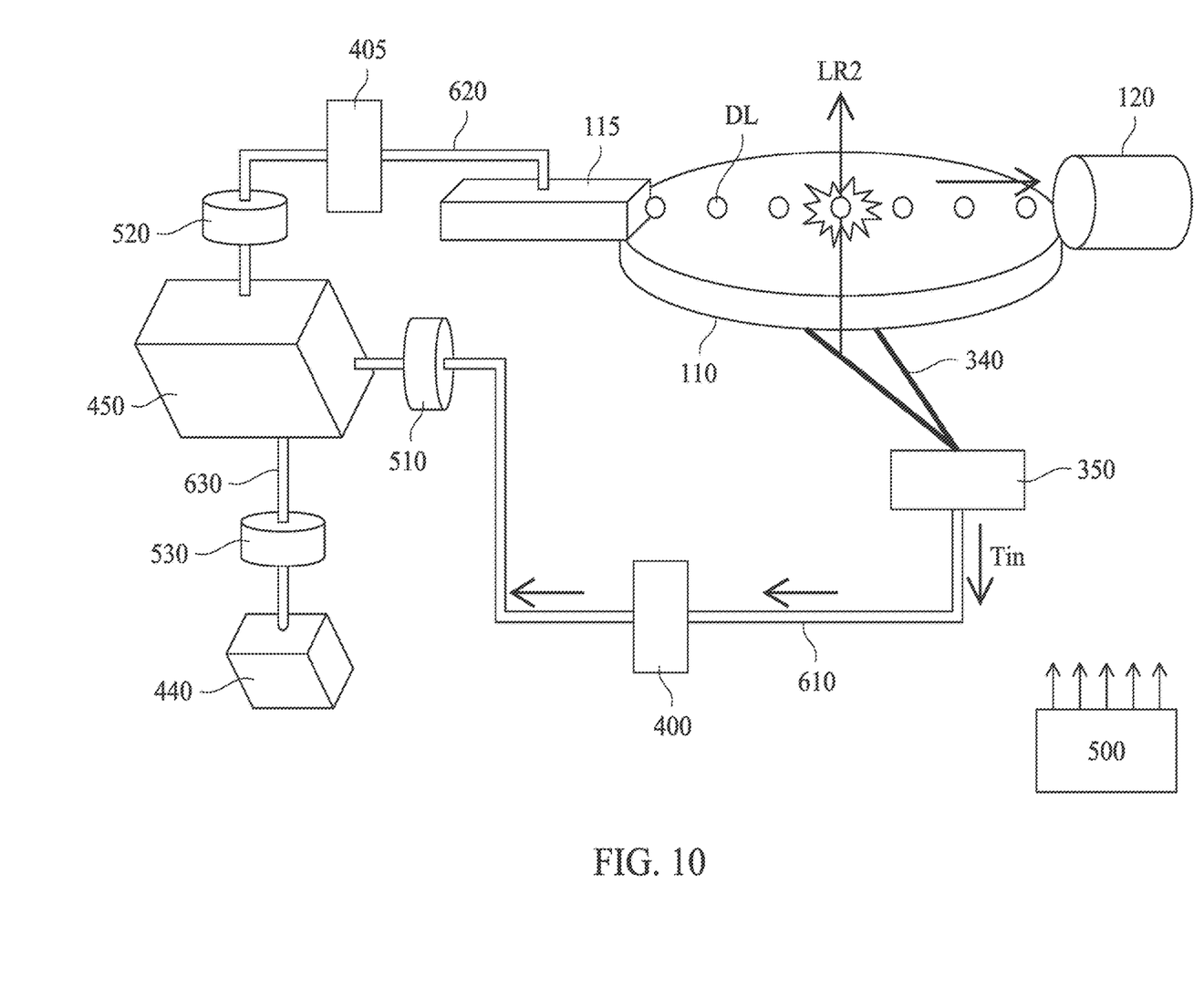
FIG. 10 shows a schematic view of an EUV radiation source apparatus according to an embodiment of the present disclosure.

FIG. 10 shows a configuration of a tin reuse system for an EUV radiation source according to an embodiment of the present disclosure. In this embodiment, the metal (tin) debris melted at the EUV collector mirror 110 is collected and reused.

As shown in FIG. 10, tin debris deposited on the EUV collector mirror 110 is collected by the drain structure. In some embodiments, the melted tin debris is guided to a tin bucket 350 via heated pipe 340. Then, the collected tin (molten tin) is directed to a tin store bucket (reservoir) 450 via a first conduit 610, on which a first valve 510 is disposed. Recycled tin stored in the tin store bucket 450, which is heated at a temperature higher than the melting point of tin, e.g., about 250° C. to about 300° C., is supplied to a target droplet generator 115 via a second conduit 620, on which a second valve 520 is disposed. Further, a pressurizing device 440 is coupled to the tin store bucket 450 via a third conduit 630, on which a third valve 530 is disposed. In some embodiments, the pressurizing device 440 includes a compressor, a pump, or any other device that can increase a gas pressure. In some embodiments, a facility gas supply (e.g., $N_2$) or a pressurized gas tank through a regulator is used.

In some embodiments, at least the first conduit 610 and the second conduit 620 and the first valve 510 and the second valve 520 are heated at a temperature higher than the melting point of tin, e.g., about 250° C. to about 300° C. A controller 500 controls operations of the pressurizing device 440 and the first to third valves. In some embodiments, the controller 500 includes a processor and a memory storing a control program and when the control program is executed by the processor, the control program causes the processor to perform intended operations. In other embodiments, the controller 500 includes by an electronic circuit, such as a semiconductor microcomputer.

In some embodiments, a first tin purification device 400 is provided on the first conduit 610 and/or a second tin purification device 405 is provided on the second conduit 620. In some embodiments, the tin purification devices include a filter to purify the recycled tin before refilling back to the tin droplet generator 115. In some embodiments, the filter includes a porous membrane to filter particles having a size greater than about 1.0 µm to about 2.0 µm (e.g., about 1.5 µm). In certain embodiments, the filter has a pore size (diameter) in a range from about 1.0 µm to about 2.0 µm. In certain embodiments, the filter is a ceramic filter, such as a ceramic honeycomb filter and a ceramic foam filter. In some embodiments, the filter removes particles having diameter larger than 1.0 µm, such as about 100 µm.

In a normal condition of the EUV radiation source, molten tin is stored in the target droplet generator 115, and tin droplets are generated by the target droplet generator 115. The tin droplet are irradiated by the excitation laser LR2 in front of the collector 110, thereby generating EUV light. The tin debris deposited on the EUV collector mirror and collected by the drain structure is directed to the heated tin bucket 350.

In the normal condition, the first valve 510 is opened to collect the recycled tin into the tin store bucket 450, while the second valve 520 and the third valve 530 are closed. When the target droplet generator 115 runs out of tin or the stored tin in the target droplet generator 115 is less than a threshold amount, the third valve 530 and the second valve 520 are opened, and the pressurizing device is operated to provide a pressurizing gas to the tin store bucket 450, thereby molten tin is supplied to fill the tin droplet generator 115. The pressuring gas is one or more of $H_2$, He, Ar, $N_2$ or another inert gas in some embodiments. In the configuration of FIG. 10, the tin collected by the droplet catcher 120 is not reused. In other embodiments, the tin collected by the droplet catcher 120 is reused. In some embodiments, the amount of tin in the target droplet generator 115 is monitored by the controller 500.

It will be understood that not all advantages have been necessarily discussed herein, no particular advantage is required for all embodiments or examples, and other embodiments or examples may offer different advantages.

According to an embodiment of the present disclosure, an EUV collector mirror includes a heating structure implemented on the EUV collector mirror to self-destroy the metal-contamination, openable/closable melting hole to drain out the melted metallic liquid, and a grating drain path to mitigate the impact of reflectivity loss by the drain holes and cross area contamination. Further, an EUV collector mirror includes a drain structure having opening (slits or grooves) to collect the melted metal debris, thereby reducing the reflectivity loss of the EUV collector mirror. In addition, by recycling the metal, it is possible to reduce the cost of operating the EUV radiation source apparatus.

In accordance with one aspect of the present disclosure, an EUV collector mirror for an extreme ultra violet (EUV) radiation source apparatus includes an EUV collector mirror body on which a reflective layer as a reflective surface is disposed, a heater attached to or embedded in the EUV collector mirror body, and a drain structure to drain melted metal from the reflective surface of the EUV collector mirror body to a back side of the EUV collector mirror body. In one or more of the foregoing and the following embodiments, the EUV collector mirror further includes a drain hole coupled to the drain structure. In one or more of the foregoing and the following embodiments, the drain structure includes an opening at the reflective surface and a conduit connecting the opening and the drain hole. In one or more of the foregoing and the following embodiments, the opening is a slit passing through the EUV collector mirror body. In one or more of the foregoing and the following embodiments, the drain structure further includes a support provided at a bottom of the slit and having an EUV reflective surface. In one or more of the foregoing and the following embodiments, the support having the EUV reflective surface have a curvature such that EUV radiation reflected at the support having the EUV reflective surface and EUV radiation reflected at the reflective surface on the EUV collector mirror body have a same focal point. In one or more of the foregoing and the following embodiments, the opening is a groove formed in the EUV collector mirror body having a bottom surface on the EUV collector mirror body. In one or more of the foregoing and the following embodiments, the bottom surface has an EUV reflective surface. In one or more of the foregoing and the following embodiments, the bottom surface having the EUV reflective surface has a curvature such that EUV radiation reflected at the bottom surface having the EUV reflective surface and EUV radiation reflected at the reflective surface on the EUV collector mirror body have a same focal point. In one or more of the foregoing and the following embodiments, the opening includes multiple openings arranged in a concentric manner, and the multiple openings are slits or grooves. In one or more of the foregoing and the following embodiments, the multiple openings arranged in a concentric manner are connected by a trunk conduit disposed on the back side of the EUV collector mirror body or in the EUV collector mirror body. In one or more of the foregoing and the following embodiments, the opening includes a trunk conduit and multiple openings branching from the trunk conduit, and the multiple openings are slits or grooves. In one or more of the foregoing and the following embodiments, the trunk conduit is disposed on the back side of the EUV collector mirror body or in the EUV collector mirror body. In one or more of the foregoing and the following embodiments, a width of the opening is in a range from 0.5 mm to 5 mm. In one or more of the foregoing and the following embodiments, the EUV collector mirror further includes a heater controller to control heating of the EUV collector mirror body.

In accordance with another aspect of the present disclosure, an EUV radiation source apparatus includes an EUV collector mirror, a target droplet generator for generating a tin (Sn) droplet, a rotatable debris collection mechanism, and a chamber enclosing at least the EUV collector mirror and the rotatable debris collection mechanism. The EUV collector mirror includes an EUV collector mirror body on which a reflective layer as a reflective surface is disposed, a heater attached to or embedded in the EUV collector mirror body, and a drain structure to drain melted metal from the reflective surface of the EUV collector mirror body to a back side of the EUV collector mirror body. In one or more of the foregoing and the following embodiments, the drain structure includes an opening at the reflective surface, a drain hole and a conduit connecting the opening and the drain hole, and the opening is a slit passing through the EUV collector mirror body or a groove on the EUV collector mirror body having a bottom surface in the EUV collector mirror body. In one or more of the foregoing and the following embodiments, the drain structure includes an EUV reflective surface at a bottom of the opening, and the EUV reflective surface has a curvature such that EUV radiation reflected at the EUV reflective surface and EUV radiation reflected at the reflective surface on the EUV collector mirror body have a same focal point. In one or more of the foregoing and the following embodiments, the opening includes multiple openings arranged in a concentric manner.

In accordance with another aspect of the present disclosure, an extreme ultra violet (EUV) radiation source apparatus includes an EUV collector mirror, a target droplet generator for generating a tin (Sn) droplet, a rotatable debris collection mechanism, a chamber enclosing at least the EUV collector mirror and the rotatable debris collection mechanism, and a metal reuse system. The EUV collector mirror includes an EUV collector mirror body on which a reflective layer as a reflective surface is disposed, a heater attached to or embedded in the EUV collector mirror body, and a drain structure to drain melted metal from the reflective surface of the EUV collector mirror body to a back side of the EUV collector mirror body. Melted metal drained from the drain structure is directed to the metal reuse system and further provided to the target droplet generator.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An EUV collector mirror for an extreme ultra violet (EUV) radiation source apparatus, comprising:
    an EUV collector mirror body on which a reflective layer as a reflective surface is disposed;
    a heater attached to the EUV collector mirror;
    a drain structure to drain melted metal from the reflective surface of the EUV collector mirror body to a back side of the EUV collector mirror body; and
    a drain hole coupled to the drain structure, wherein the drain structure and the drain hole are configured such that the melted metal flows through the drain structure by gravity,
    wherein the drain structure includes an opening that comprises a plurality of slits or a plurality of grooves provided at the reflective surface of the EUV collector mirror, which are connected to the drain hole.

2. The EUV collector mirror of claim 1, wherein the drain hole is disposed at a lowest position of the EUV collector mirror.

3. The EUV collector mirror of claim 1, wherein the drain structure includes a conduit connecting the plurality of slits or grooves and the drain hole.

4. The EUV collector mirror of claim 1, wherein the opening is the plurality of slits and the plurality of slits pass through the EUV collector mirror body.

5. The EUV collector mirror of claim 3, wherein the opening is the plurality of grooves formed in the EUV collector mirror body and each of the plurality of grooves comprises a bottom surface that extends along a back side of the EUV collector mirror body.

6. The EUV collector mirror of claim 5, wherein each bottom surface has an EUV reflective surface.

7. The EUV collector mirror of claim 6, wherein each bottom surface comprises a curvature such that EUV radiation reflected at each bottom surface and EUV radiation reflected at the reflective surface on the EUV collector mirror body have a same focal point.

8. The EUV collector mirror of claim 1, wherein the plurality of slits or grooves are arranged in a concentric manner.

9. The EUV collector mirror of claim 8, wherein the plurality of slits or grooves arranged in a concentric manner are connected by a trunk conduit disposed on the back side of the EUV collector mirror body or in the EUV collector mirror body.

10. An EUV collector mirror for an extreme ultra violet (EUV) radiation source apparatus, comprising:
    an EUV collector mirror body on which a reflective layer as a reflective surface is disposed;
    a heater attached to the EUV collector mirror;
    a drain structure to drain melted metal from the reflective surface of the EUV collector mirror body to a back side of the EUV collector mirror body; and
    a drain hole coupled to the drain structure, wherein the drain structure and the drain hole are configured such that the melted metal flows through the drain structure by gravity,
    wherein the drain structure includes a trunk conduit and multiple openings branching from the trunk conduit.

11. The EUV collector mirror of claim 10, wherein the multiple openings are slits or grooves.

12. The EUV collector mirror of claim 10, wherein the trunk conduit is disposed on the back side of the EUV collector mirror body or in the EUV collector mirror body.

13. The EUV collector mirror of claim 10, wherein a width of each of the multiple openings is in a range from 0.5 mm to 5 mm.

14. The EUV collector mirror of claim 10, wherein the drain structure further includes a support provided at a bottom of each of the multiple openings.

15. The EUV collector mirror of claim 14, wherein each support comprises an EUV reflective surface that has a curvature such that EUV radiation reflected at the support having the EUV reflective surface and EUV radiation reflected at the reflective surface on the EUV collector mirror body have a same focal point.

16. An extreme ultra violet (EUV) radiation source apparatus, comprising:
    an EUV collector mirror;
    a heater attached to the EUV collector mirror;
    a target droplet generator for generating a tin (Sn) droplet;
    a rotatable debris collection mechanism; and
    a chamber enclosing at least the EUV collector mirror and the rotatable debris collection mechanism, wherein the EUV collector mirror includes:

an EUV collector mirror body on which a reflective layer as a reflective surface is disposed;

a drain structure to drain melted metal from the reflective surface of the EUV collector mirror body to a back side of the EUV collector mirror body; and a drain hole coupled to the drain structure, wherein the drain structure and the drain hole are configured such that the melted metal flows through the drain structure by gravity, wherein the drain structure includes multiple openings each having a bottom comprising a bottom EUV reflective surface.

17. The EUV radiation source apparatus of claim 16, wherein:

each of the multiple openings is a groove in the EUV collector mirror body having the bottom on the EUV collector mirror body.

18. The EUV radiation source apparatus of claim 16, wherein:

each of the multiple openings is a slit passing through the EUV collector mirror body, and a support having the bottom is provided to the slit.

19. The EUV radiation source apparatus of claim 16, wherein:

the bottom has a curvature such that EUV radiation reflected at the bottom EUV reflective surface.

20. The EUV radiation source apparatus of claim 16, wherein EUV radiation reflected at the reflective surface on the EUV collector mirror body have a same focal point.

* * * * *